United States Patent

Smith et al.

[11] Patent Number: 5,523,701
[45] Date of Patent: Jun. 4, 1996

[54] METHOD AND APPARATUS FOR MONITORING MACHINE PERFORMANCE

[75] Inventors: Stephen F. Smith, Loudon; Kimberly N. Castleberry, Harriman, both of Tenn.

[73] Assignee: Martin Marietta Energy Systems, Inc., Oak Ridge, Tenn.

[21] Appl. No.: 263,344

[22] Filed: Jun. 21, 1994

[51] Int. Cl.$^6$ .................................................... G01R 31/00
[52] U.S. Cl. ........................................ 324/772; 324/117 H
[58] Field of Search ................................ 324/772, 117 H, 324/545

[56] References Cited

U.S. PATENT DOCUMENTS

| | | |
|---|---|---|
| 3,842,663 | 11/1974 | Harting et al. . |
| 4,639,665 | 1/1987 | Gary .................................... 324/117 H |
| 4,773,263 | 9/1988 | Lesage et al. . |
| 4,965,513 | 11/1990 | Haynes et al. . |
| 4,978,909 | 12/1990 | Hendrix et al. . |
| 5,058,434 | 11/1991 | Zaschel . |
| 5,187,434 | 2/1993 | Ando . |

*Primary Examiner*—Kenneth A. Wieder
*Assistant Examiner*—Kourosh Cyrus Khosravi
*Attorney, Agent, or Firm*—E. A. Pennington; J. M. Spicer; H. W. Adams

[57] ABSTRACT

Machine operating conditions can be monitored by analyzing, in either the time or frequency domain, the spectral components of the motor current. Changes in the electric background noise, induced by mechanical variations in the machine, are correlated to changes in the operating parameters of the machine.

15 Claims, 9 Drawing Sheets

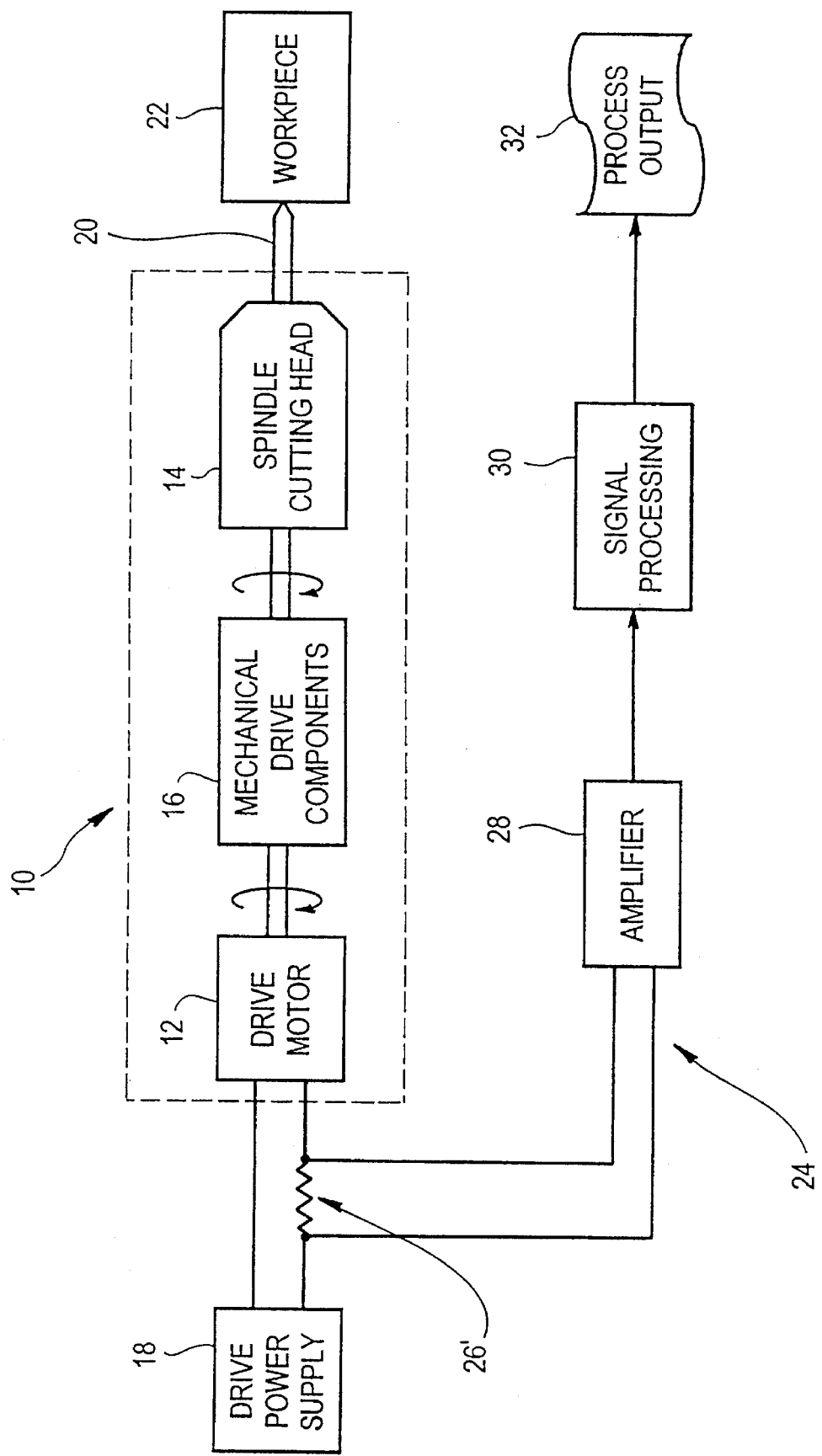

5,523,701

METHOD AND APPARATUS FOR MONITORING MACHINE PERFORMANCE

This invention was made with Government support under contract DE-AC05-84OR21400 awarded by the U.S. Department of Energy to Martin Marietta Energy Systems, Inc. and the Government has certain rights in this invention.

FIELD OF THE INVENTION

The present invention relates generally to diagnostic and monitoring systems for machinery operated by electric motors and, more specifically, to the use of a frequency spectrum of the motor current to determine machine operating parameters. Statistical analysis of the current signal is used to provide dynamic monitoring of machine operational parameters. For a cutting tool, these would include instantaneous spindle torque, tool speed, and load.

BACKGROUND OF THE INVENTION

In machining, boring, milling, and similar operations involving metal, wood, plastics, ceramics, composites, and other workable materials, it is generally difficult to determine the overall health and efficiency of the material removal process. Methods most often employed by the machinist include visual inspection or the sound of the operation. This is generally a very subjective assessment invariably based on the experience of the individual machinist.

U.S. Pat. No. 4,978,909 to Hendrix et al. describes a demodulation circuit for motor current spectral analysis. Motor current is monitored, filtered, demodulated and amplified, and then fed to a frequency analyzer for determination of motor current signatures. In this Patent, the peak frequencies are analyzed and correlated to certain operating parameters.

U.S. Pat. No. 5,058,434 to Zaschel discloses a process for early detection of damage to machine parts. The process involves the use of transducers to sense machine vibration. The transducers produce an electrical signal which is broken down into periodically determined stochastic components.

U.S. Pat. No. 3,842,663 to Harting et al. discloses an apparatus for detecting defects in a mechanical system, in which a transducer is used to produce an electrical signal. The signal is demodulated and then spectrally analyzed.

U.S. Pat. No. 5,187,434 to Ando discloses an apparatus for detecting machining conditions of a workpiece. Excitation current to a magnetic bearing is monitored and compared to preset values to derive a machine condition.

U.S. Pat. No. 4,965,513 to Haynes et al. discloses a motor current signature analysis technique in which current peaks at specific frequencies are analyzed to determine operability of a valve.

Certain types of machine operating parameters would be difficult to analyze using prior art techniques. For example, the gradual wear of a cutting tool would not necessarily produce an observable frequency phenomenon. Thus, a continuing need exists for current signature analysis techniques which are not dependent on discrete frequency analysis.

SUMMARY OF THE INVENTION

An object of the present invention is to provide an apparatus and method for monitoring machine tool performance which is capable of monitoring condition of the drive motor, as well as the process of machining such as tool speed, torque, torque variations, and mechanism changes, which include gear tooth wear, shaft binding, belt slap, and spindle wobble, among others.

Another object of the present invention is to provide an apparatus and method for monitoring machine tool performance which is non-invasive and capable of providing an early warning of mechanical deficiencies, drive motor problems not yet manifest, cutting tool wear or damage, material quality inconsistencies (e.g., voids, inclusions, hardness variations), spindle or material misalignments and general mechanical integrity.

Another object of the present invention is to provide a method and apparatus for monitoring machine tool performance which is relatively simple to retroactively install on existing equipment and easy to operate, whereby operational data can be processed for statistical trending to yield quality control information.

These and other objects of the invention are met by providing an apparatus for monitoring operating parameters of a machine powered by an electric motor, which includes means for sensing current drawn by the electric motor and producing an electric signal which has a noise-like component which varies in accordance with, at least, one machine operating parameter, and means for correlating changes in the noise-like component to changes in at least one machine operating parameter.

Other objects, advantages and salient features of the invention will become apparent from the following detailed description, which taken in conjunction with the annexed drawings, discloses preferred embodiments of the invention.

BRIEF DESCRIPTION OF THE DRAWINGS

FIG. 1A is a variation of the embodiment of FIG. 1;

DETAILED DESCRIPTION OF THE INVENTION

Figure 1:
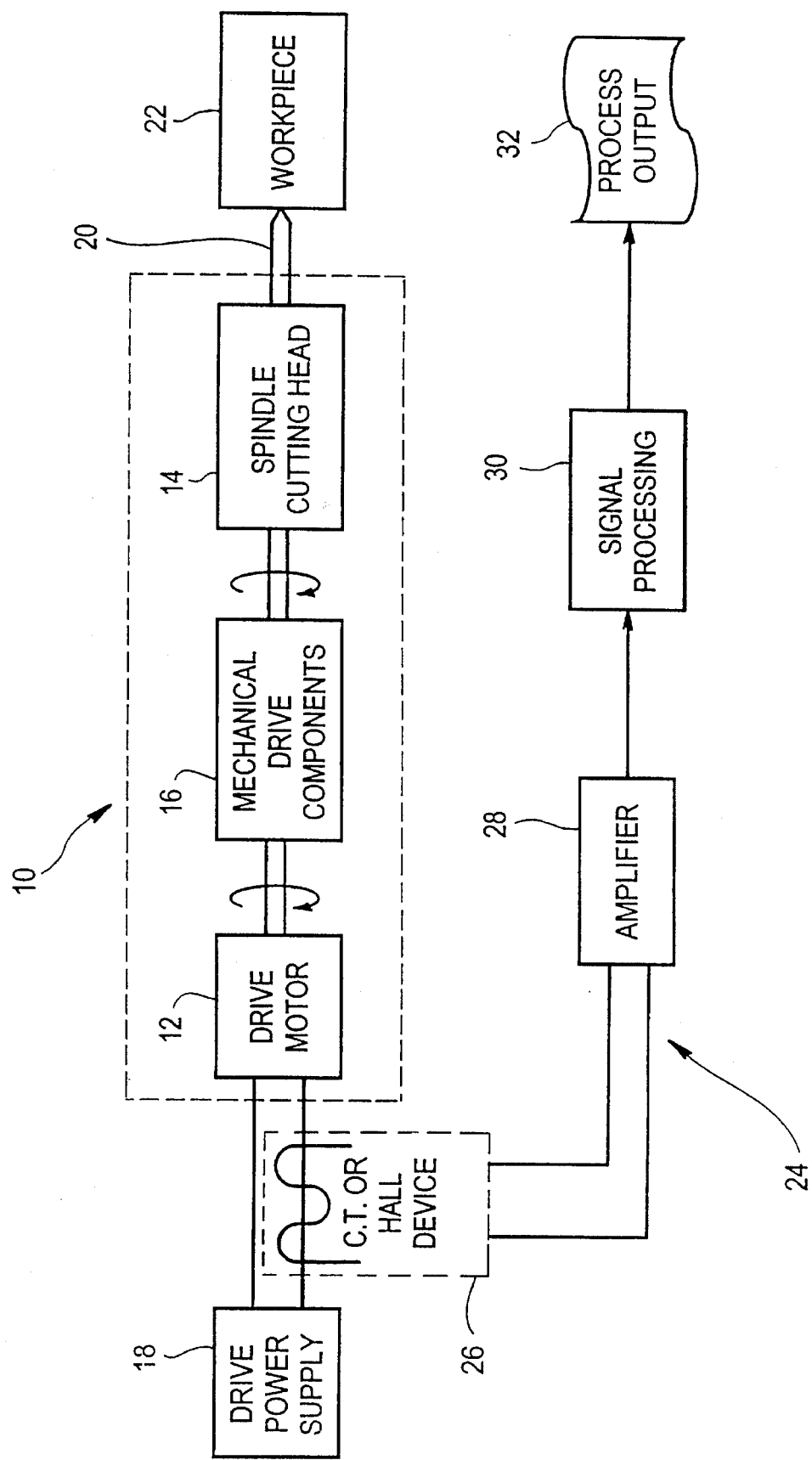
FIG. 1 is a schematic view of a first preferred embodiment of the present invention.

By way of illustration, FIG. 1 shows a machining tool 10 which includes an electric drive motor 12, which drives a spindle cutting head 14 through mechanical drive components 16. The drive motor 12 is provided with electric power from drive power supply 18. The simple cutting head supports a tool 20 which performs a metal working operation on a workpiece 22.

An apparatus 24 for monitoring operation of the machining tool 10 includes a device 26 for sensing motor current drawn by the motor 12. This device may comprise a clamp-on current transformer (C.T.) for use with single and polyphase AC machines, a Hall-effect sensor, typically used with DC motors, or any other suitable line current monitoring devices or transducers.

Device 26 typically delivers a signal voltage proportional to variations in motor line current. This signal is then delivered to the input of instrument amplifier 28 to obtain a useable, high-fidelity level for the signal of interest while rejecting other undesirable signals.

FIG. 1A illustrates a variation where the sensing device is a low value resistor 26' connected in series with one of the leads of the motor 12.

The output of the amplifier 28 is delivered to a signal processing device 30, which is used to extract pertinent data that is then correlated to machine performance. The processing device 30 could be either an analog device or a digital device. In its simplest form, the device 30 could be an oscilloscope which displays the time-domain waveform of the motor current. Also, the signal processing device 30 could be a spectrum analyzer which displays the frequency-domain spectrum of the motor current. Process output 32 could be a display or a recording device.

Figure 2:
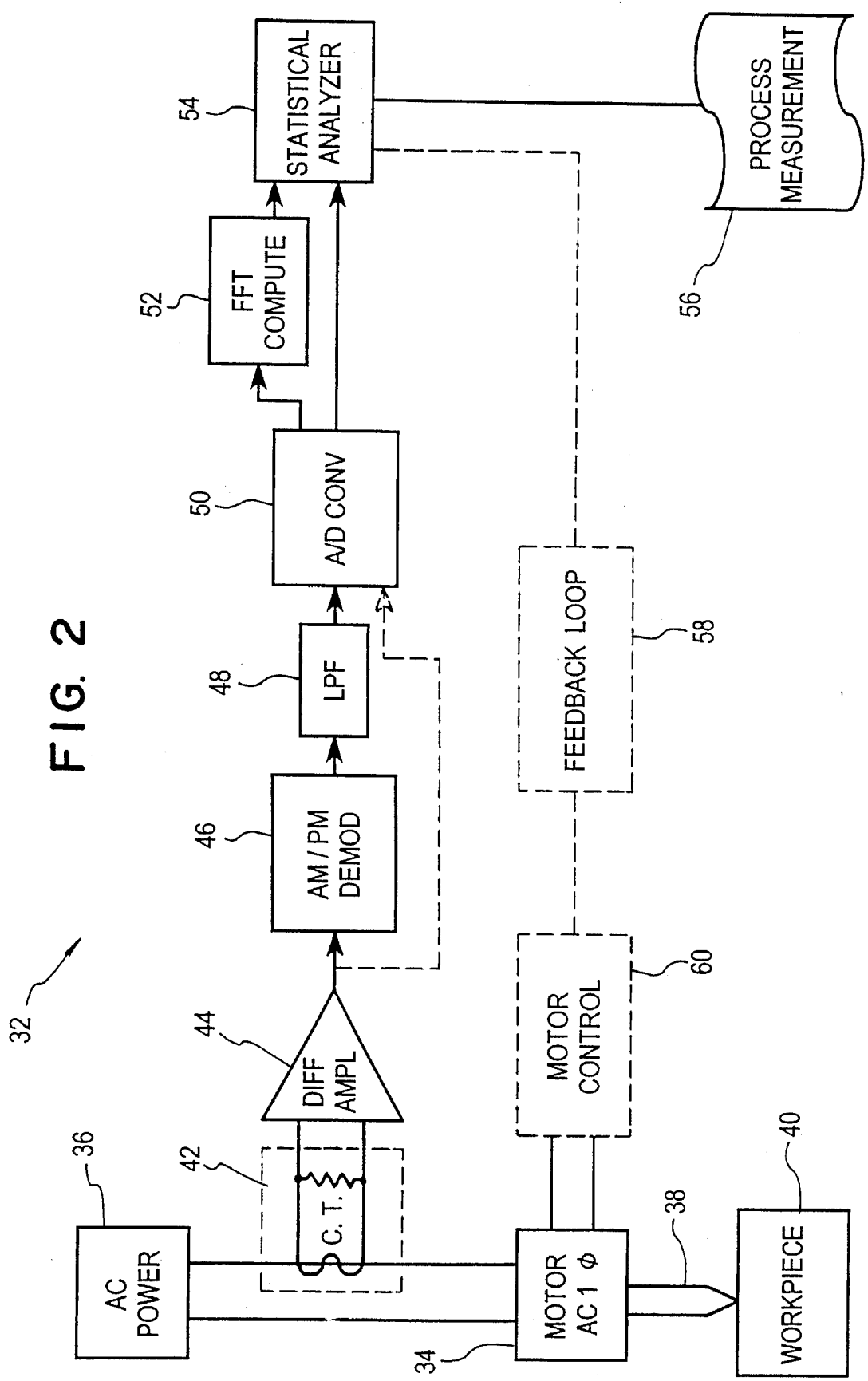
FIG. 2 is a schematic view of a second preferred embodiment of the present invention.

FIG. 2 illustrates a preferred digital signal processing embodiment. In FIG. 2, a single-phase AC motor 34 is supplied with electric current from an AC power source 36, which could be a standard receptacle for a 60-Hz commercial power line. The motor 34 drives a tool 38, which in turn performs a metal working operation on a workpiece 40.

A current sensing device 42, which in the illustrated embodiment is a current transformer (C.T.), produces an electric signal which has a "noise" component which varies in accordance with machine operation. The electric signal is fed to a differential amplifier 44, which rejects common-mode noise while amplifying signals of interest. The "noise" component is not classic electronic noise, in that the noise component carries useful information and is thus not entirely random as is classic electronic noise. The noise component is "noise-like" in that it varies in accordance with machine operation, and yet it has variations which at first glance appear random.

The AC power supply 36, in this embodiment, is of a constant frequency and has the capacity to supply the required current to the milling machine at a constant potential throughout the operation.

The amplified signal, outputted from the differential amplifier 44, is fed to an amplitude and phase demodulator 46. Here the small varying motor current signals are separated, through AM and/or PM/FM demodulation, from the relatively large 60-Hz AC line current carrier. The demodulated current signal is then routed to a low-pass filter 48 for anti-aliasing before introduction to an analog-to-digital (A/D) converter 50.

The A/D converter 50 takes the continuously varying demodulated analog current signal and assigns a numerical value to each level as often as the sample rate. These numerical values (digital data) are then routed to a FFT (Fast Fourier Transform) computer 52 to produce frequency-domain data for real-time analysis. The computer may be a personal computer programmed to provide spectral analysis. Further statistical analysis can be performed by a statistical analyzer 54 and displayed or stored at the process measurement 56.

According to the invention, the operation of a machine tool, such as a lathe, drill press, or milling machine, is monitored via the drive current to the spindle motor. Depending on whether the equipment uses a DC motor or an AC induction motor, single- or multiple-phase, one or more current transformers or Hall-effect devices may be employed to detect the motor current. The output of the transducer(s) is amplified and filtered and then processed to extract pertinent information which relates to system performance.

Typically, this processing will involve special filtering, amplitude and/or phase (or frequency) demodulation, A/D conversion, Fourier transformations, linear or nonlinear averaging, combinations of the above, or other mathematical manipulations. The specific cases of demodulation (amplitude and/or phase) have been discussed in U.S. Pat. No. 4,978,909, which is incorporated herein by reference. Other forms of processing commonly utilized include lowpass, highpass, bandpass, or band-reject filtering both before and after the demodulation circuitry. Examples of this include lowpass and bandpass filtering for anti-aliasing purposes before an A/D converter or other special function circuits such as integrators, differentiators, logarithmic converters, level comparators, or phase shifters. Both line-synchronous direct sampling and non-synchronous direct sampling can be used for digital processing.

When the AC-driven spindle shown in FIGS. 1 and 2 is operated in a boring machine, the bit speed is very load-dependent. Unloaded, the bit or "tool" would turn at some maximum value, but as the bit engages the workpiece, the spindle speed drops. This condition is reflected or modulated onto the current signal of the drive motor as load-related sideband frequencies.

For a homogeneous workpiece, the load modulation will appear as nearly Gaussian, with a typical Gaussian (normal) spectral component distribution about the rotational frequency (60 Hz, typically). Any change in the shape of this distribution (in either frequency- or time-amplitude values) denotes a change in the material characteristics of the workpiece or a similar change in the bit or drive mechanism.

According to the present invention, the determination of the variance of the spectral distribution could become a statistical measure of the process quality. If the motor current is, therefore, digitized, operations may be performed on the resulting data to determine the statistical attributes of the machining operation. For example, a Gaussian distribution with zero mean and small standard deviation is generally indicative of a sharp, smooth-running tool that is working in consistent material. As the tool dulls, the mean of the distribution (i.e., the average value of the current magnitude, rotating speed, etc.) will shift and the variance will change.

Subtle resonances developing in the process such as bit chatter on a lathe can be easily identified by the appearance of related discrete spectral components in the frequency-domain data. A system capable of performing such statistical analysis is shown in FIGS. 1 and 2. A variation of the FIG. 2 embodiment would involve a second AM/PM demodulator applied to the main rotational (carrier) signal to provide additional analysis.

While the illustrated embodiments show cutting tool machinery, virtually all motor-driven devices could be monitored using the present invention. For example, machinery used for the extrusion or pultrusion of fibers, plastics, wire, fiberglass, etc., could be monitored where the motor driving the puller or extruder assembly is monitored using the aforementioned techniques. This could also be applied to compactors, presses, rolling mills, feed screws, slurry pumps, conveyor systems, material and bottle handlers, grinding mills, robotic systems, pulverizers, automated cutters, electric vehicles, and many other motor driven processes where load variations are encountered.

To demonstrate the present invention, several typical data plots from a LeBlond metal-cutting lathe are shown in FIGS. 3–8. The unit, whose spindle drive was powered by a 60-Hz, 3-phase, 10-hp, 1715-rpm (4-pole) AC induction motor, was manually operated by a certified machinist under several types of typical production conditions and the motor current signals (from a single phase) recorded digitally in a manner specified above. Processing of the signals on playback was accomplished via wideband line-synchronous sampling or by angle demodulation of the 60-Hz power line carrier to generate the accompanying plots.

Figure 3:
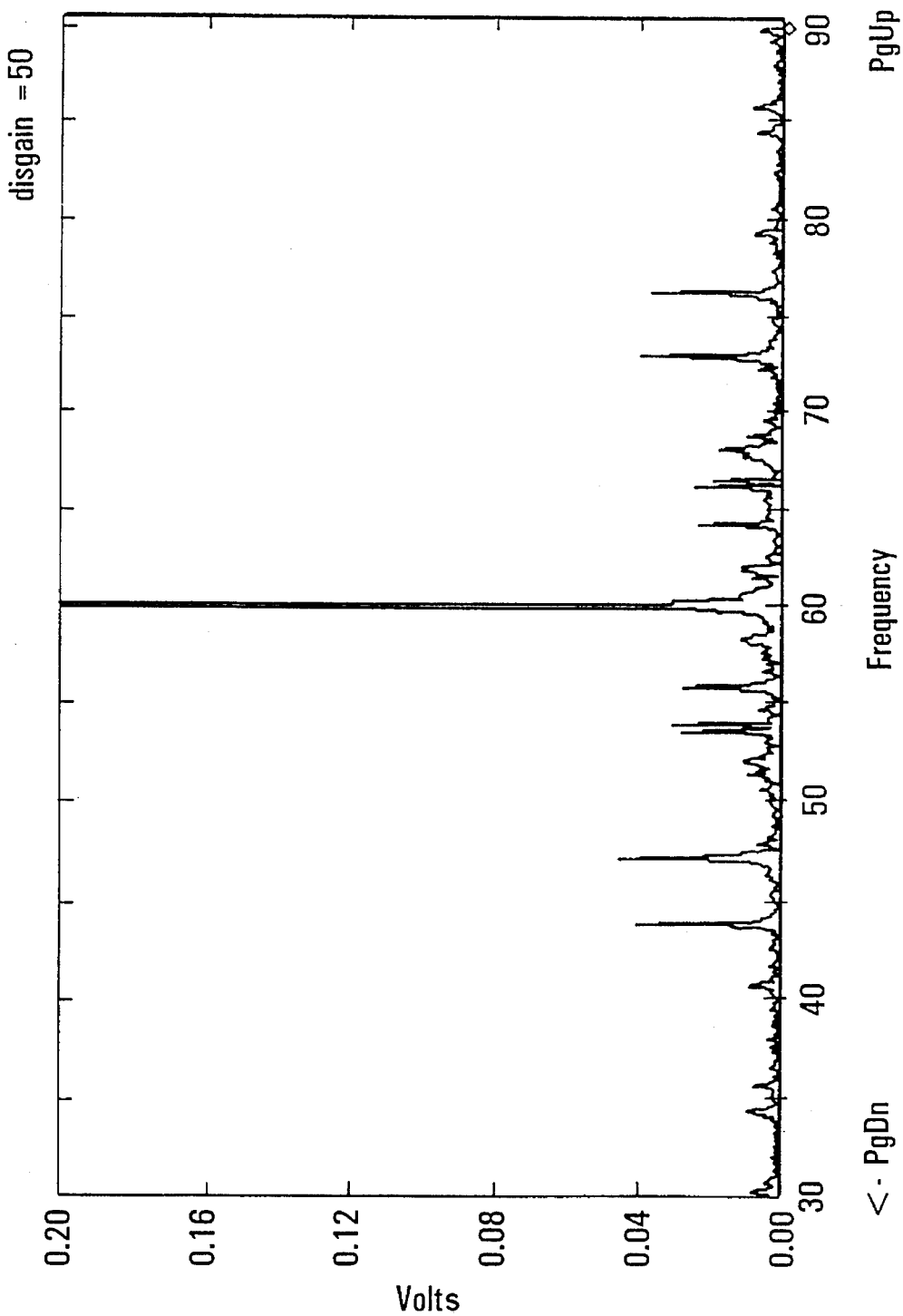
FIGS. 3–8 are frequency spectra employing the present invention.
Figure 4:
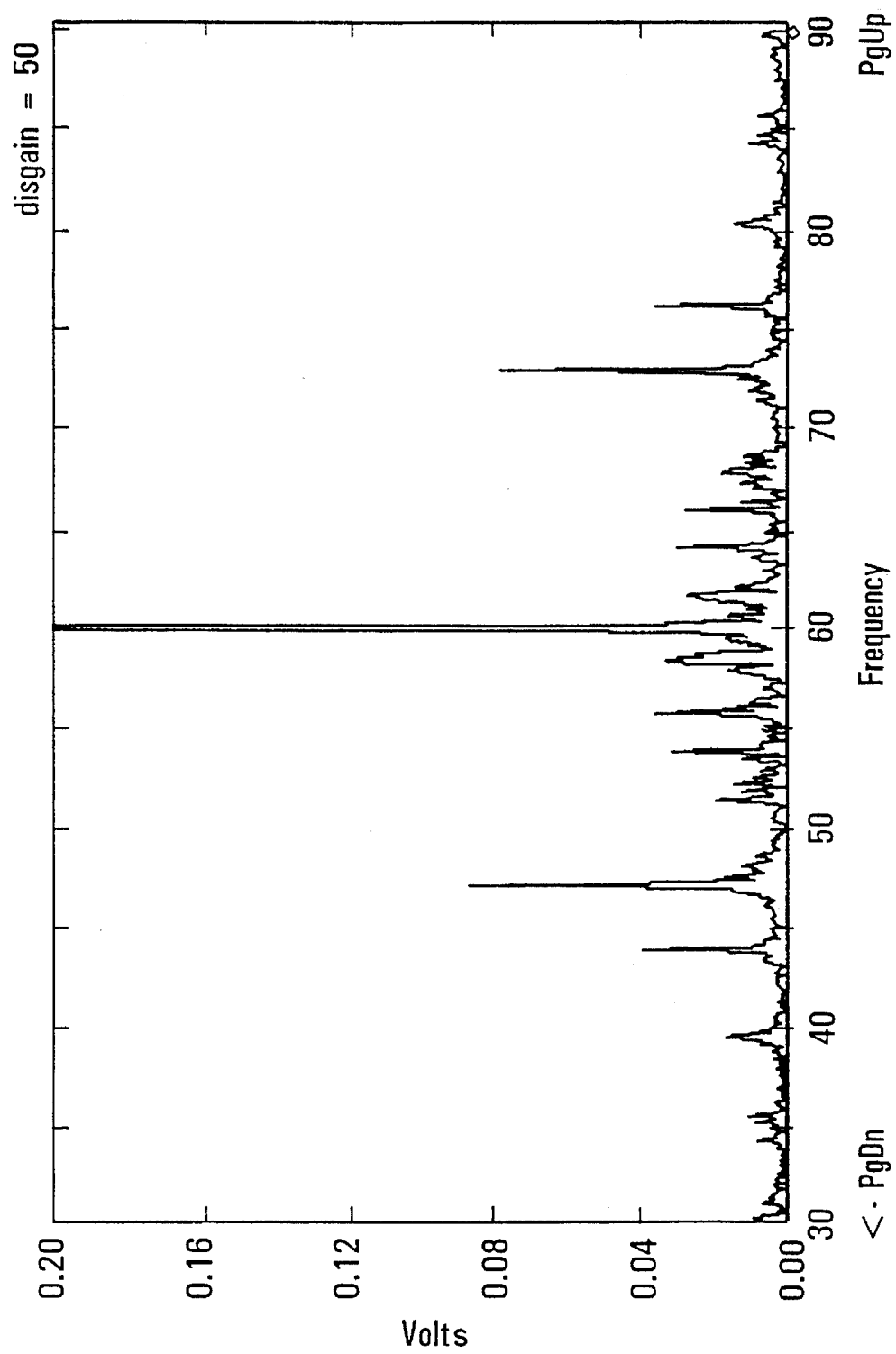

The spectra of FIGS. 3 and 4 were obtained via wideband synchronous sampling and digitization of the AC motor signal at a rate of 480 Hz (8 times line frequency). As shown in FIG. 2, the signal is passed directly to the A/D converter 50 (as shown in broken line).

The large-amplitude central frequency bin at 60-Hz represents the main power-line carrier. Sidebands above and below the carrier are also evident and correspond to the spindle's mechanical drive train. In addition, the motor slip-related components at roughly 60±2 Hz are also present, although at very low levels.

These plots were acquired from time data recorded during machining operations on standard mild-steel stock at a 256-rpm spindle speed and with a comparatively dull cutting tool. FIG. 3 shows the data from a cut depth of 0.1 inch, while FIG. 4 represents a 0.2 inch cut. In the run depicted in FIG. 4, acoustic output from the tool was considerably elevated. Although some of the peaks corresponding to spindle-gearbox shaft and gear-mesh frequencies (e.g., 6.5-Hz, 16.5-Hz) are relatively constant, others, including the 4.3-Hz spindle sideband frequencies and the 13-Hz harmonic peaks from the gearbox are considerably elevated in FIG. 4, which is the result of the higher torsional loads produced by the deeper cutting action. Further, the overall spectral "noise" floor is increased in the plot of FIG. 4, both across the band and as modulations of the various peaks, particularly the power-line carrier and its slip-related sidebands.

Figure 5:
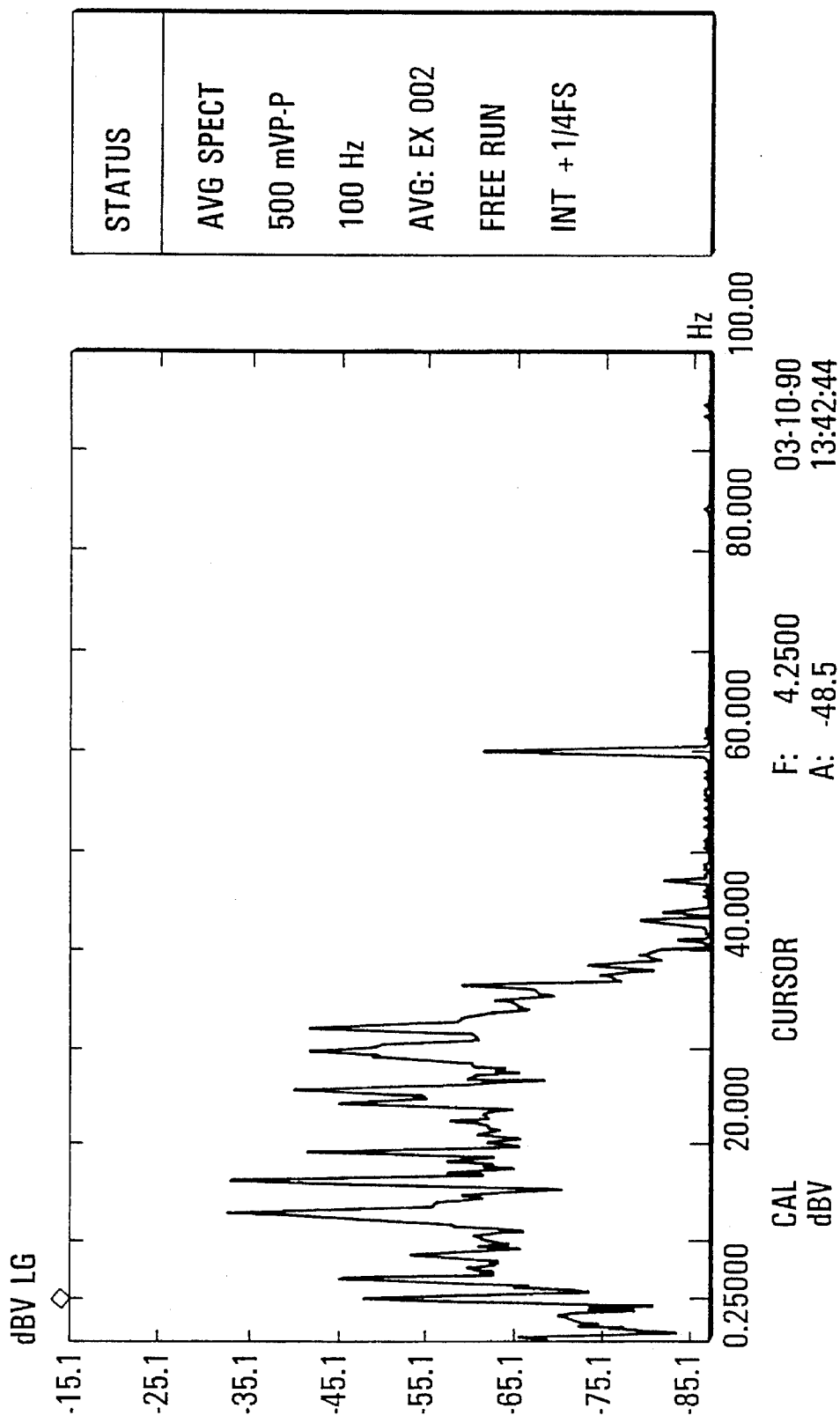

The angle-demodulated (FM) plots of FIGS. 5–8 provide a more vivid illustration of the noiselike modulation effects under various machine operating conditions. FIG. 5 shows the demodulated current spectrum from conditions similar to those of FIG. 3, where a dull 85° tool was cutting at a depth of 0.1 inch. The processing gain achieved through demodulation is evidenced by the fact that the largest of the peaks corresponds to modulation levels below about 1%, or around 50 dB below the carrier. The modulation level of the average spectral "noise" background is on the order of 0.03% (−63 dBV on the plot). It should be noted that although the modulation components displayed here are similar to those represented in FIG. 3, they are not identical. FIG. 3 includes both amplitude- and angle-modulation (AM and FM) effects, whereas FIG. 5 contains strictly the FM information. In addition, the data-averaging algorithms employed are somewhat different.

Figure 6:
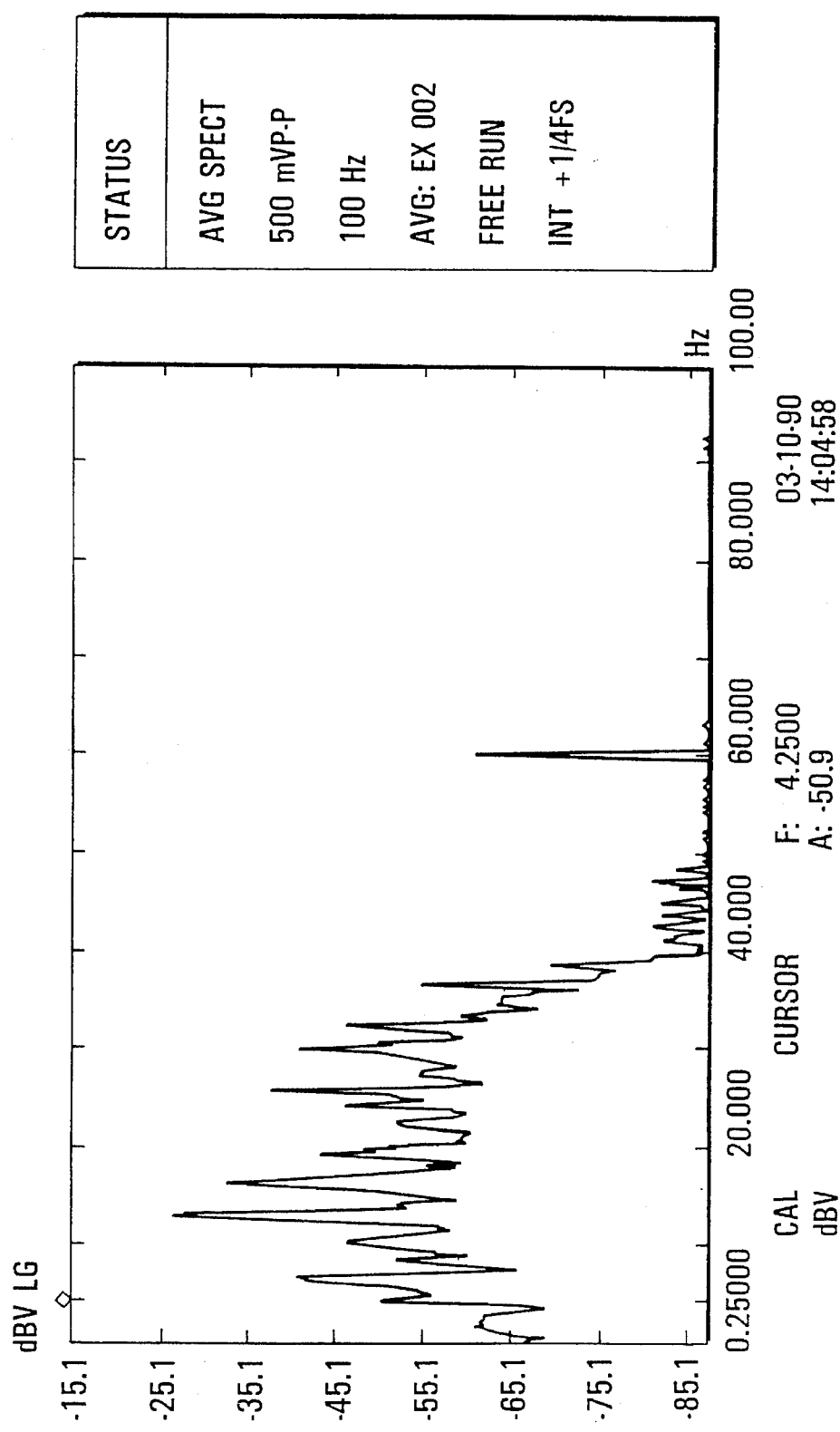
Figure 7:
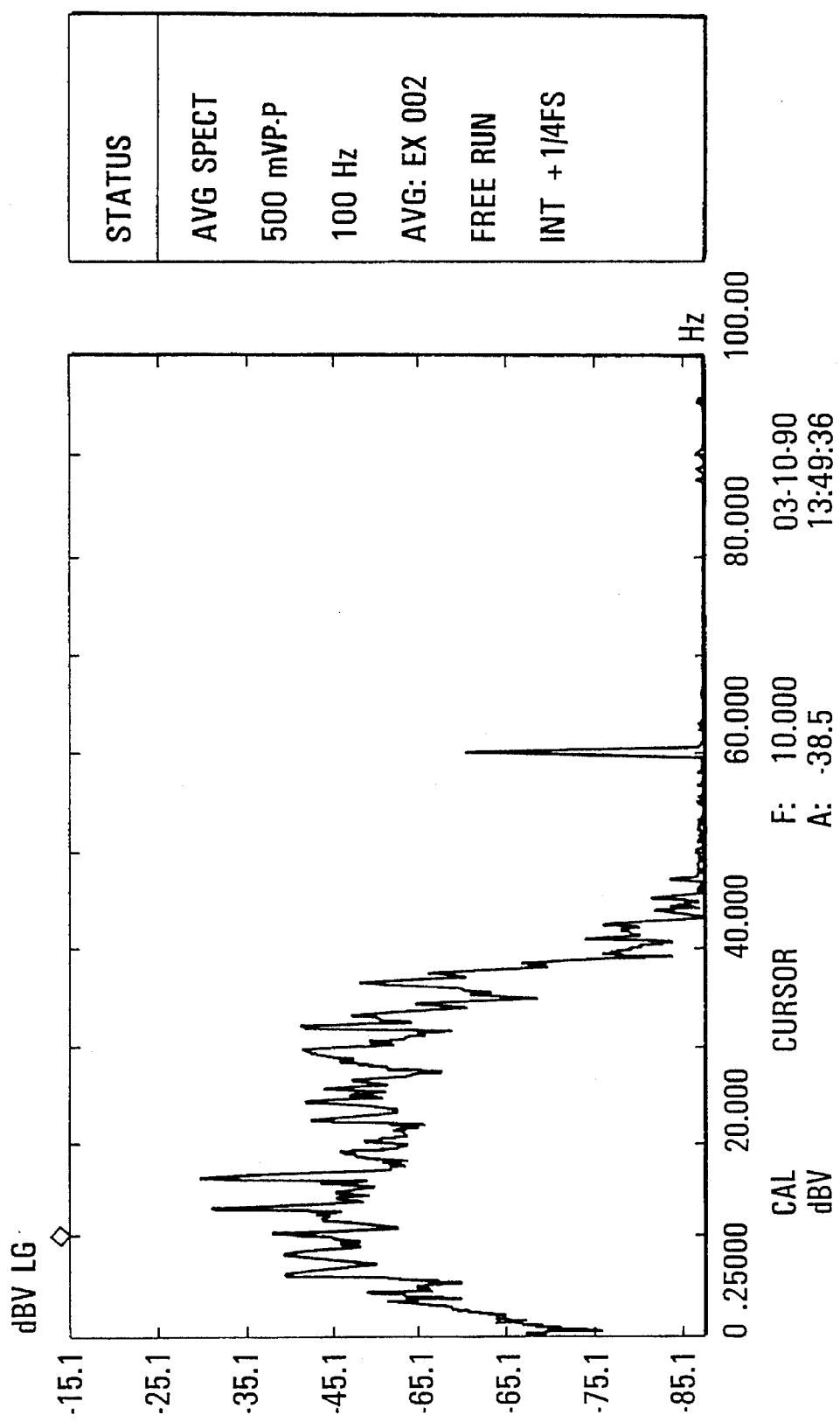

FIG. 6 presents the signature of the same spindle speed and cut depth, but now with a sharp tool. The effect is to increase the cutting efficiency and the material removal rate, as indicated by the elevated noise-like background level (≈0.06%, or ≈6 dB higher than the previous plot).

Figure 8:
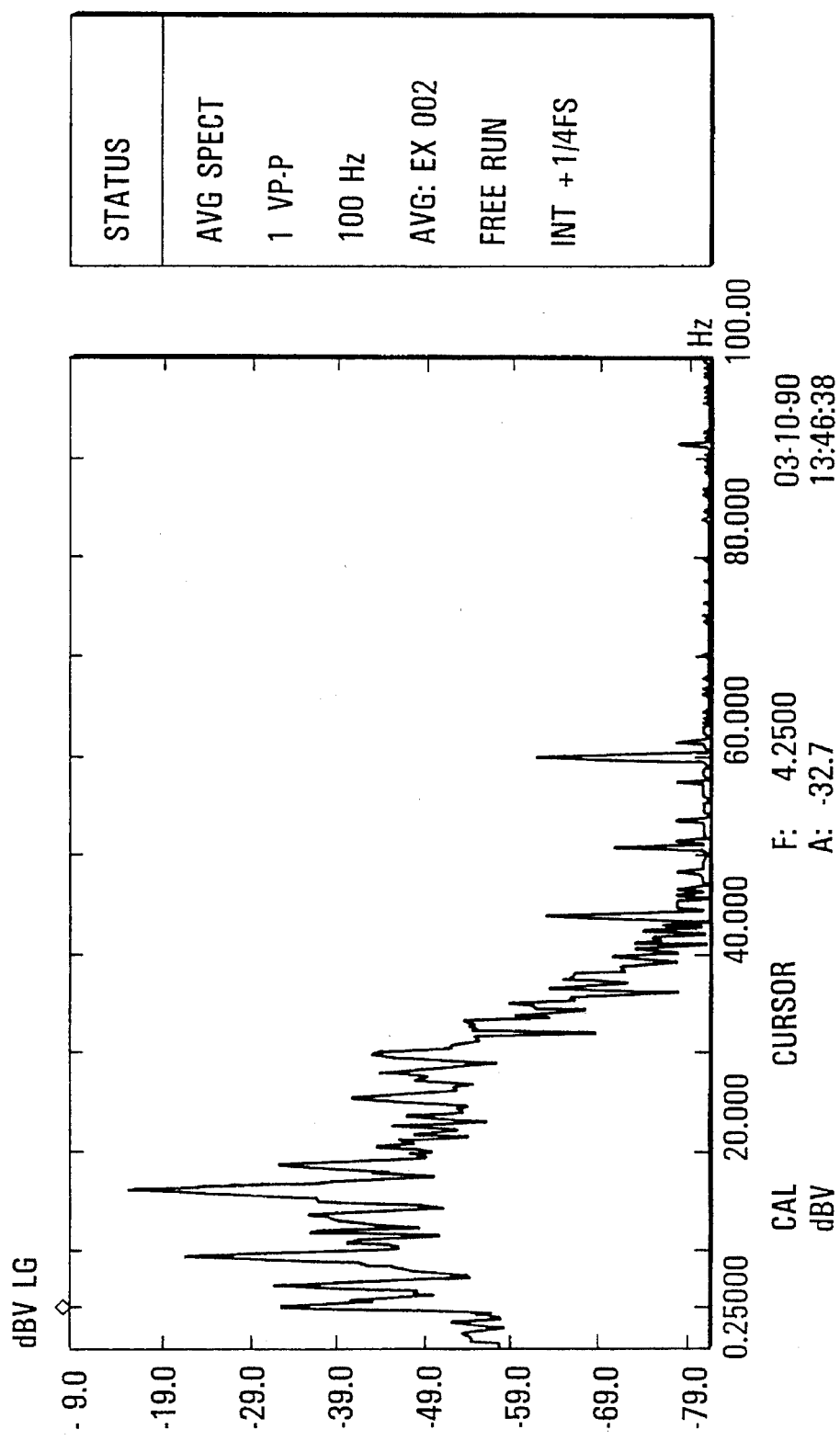

For comparison, the same (sharp) tool of FIG. 6 was employed at the same spindle speed to generate a 0.2 inch cut. The spectrum of FIG. 7 reflects the increased machining load in the overall background level of roughly −51 dBV, which is again about 6 dB higher than the corresponding parameter of FIG. 6. Also using FIG. 6 as a reference, the spindle speed was increased to ≈650 rpm (10.8 Hz), again with a cut depth of 0.1 inch. Factoring in the 2:1 scale change, the plot of FIG. 8 shows a somewhat higher noise-band level of −49 dBV, or approximately 8 dB above the level of FIG. 6. This suggest that the higher speed is more efficient for removing material, but at the expense of greater surface variability, as evidenced by the "rougher" spectral distribution of FIG. 8.

Significantly, the present invention looks at random variations in the apparent noise floor, and by trending changes in the noise floor, changes in operating conditions can be determined. The apparent noise floor is electric noise induced by mechanical variations in the machine, as opposed to general electric background noise.

The changes that are sensed can be used to change the machine operating conditions through a feedback loop 58 coupled to a motor control 60 associated with the AC motor 34 of FIG. 2. Thus, for example, as the tool 38 gradually wears, motor rpm can be accordingly adjusted automatically to maintain optimum conditions.

While advantageous embodiments have been chosen to illustrate the invention, it will be understood by those skilled in the art that various changes and modifications can be made therein without departing from the scope of the invention as defined in the appended claims.

What is claimed is:

1. An apparatus for monitoring operating parameters of a machine rotated by an electric motor, comprising:

means for sensing current drawn by the electric motor and producing an electric signal having a mechanically-induced random noise component which varies in accordance with a mechanical condition of the machine; and means for correlating changes in the mechanically-induced random noise component to changes in the mechanical condition of the machine.

2. An apparatus according to claim 1, wherein the sensing means is a current transformer.

3. An apparatus according to claim 1, wherein the sensing means is a low value dropping resistor in series with at least one lead wire of the motor.

4. An apparatus according to claim 1, wherein the sensing means is a Hall effect sensor.

5. An apparatus according to claim 1, wherein the correlating means includes a spectrum analyzer.

6. An apparatus according to claim 1, wherein the correlating means comprises an amplifier connected to the sensing means, a demodulator connected to an output of the amplifier, an analog-to-digital converter connected to an output of the demodulator, and a computer for producing a frequency domain spectrum of the motor current.

7. An apparatus according to claim 1, wherein the machine is a cutting machine and the condition is tool sharpness and depth of cut.

8. An apparatus according to claim 1, wherein the correlating means comprises an amplifier connected to the sensing means, an analog-to-digital converter connected to an output of the amplifier, and a computer for producing a frequency domain spectrum of the motor current.

9. A method for monitoring operating parameters of a machine rotated by an electric motor, comprising the steps of:

sensing current drawn by the electric motor;

producing an electric signal from the sensed current, the electric signal having a mechanically-induced random noise component which varies in accordance with a condition of the machine; and correlating changes in the mechanically-induced random noise component to changes in the mechanical condition of the machine.

10. A method according to claim 9, wherein the sensing step comprises attaching a current transformer to a lead of the electric motor.

11. A method according to claim 9, wherein the sensing step comprises connecting a dropping resistor in series with at least one lead wire of the motor.

12. A method according to claim 9, wherein the sensing step comprises positioning a Hall-effect sensor near a current supply of the electric motor.

13. A method according to claim 9, wherein the correlating step comprises amplifying the electric signal, demodulating the amplified signal, converting the demodulated signal from analog to digital, and performing a frequency transform on the digital signal.

14. A method according to claim 9, wherein the correlating step comprises amplifying the electric signal, converting the amplified signal from analog to digital, and performing a frequency transform on the digital signal.

15. A method according to claim 9, wherein the correlating step comprises amplifying the electric signal, converting the demodulated signal from analog to digital, and performing a frequency transform on the digital signal.

* * * * *